United States Patent
Gonzalez et al.

[11] Patent Number: 6,114,223
[45] Date of Patent: *Sep. 5, 2000

[54] GETTERING REGIONS AND METHODS OF FORMING GETTERING REGIONS WITHIN A SEMICONDUCTOR WAFER

[75] Inventors: Fernando Gonzalez; Jeffrey W. Honeycutt, both of Boise, Id.

[73] Assignee: Micron Technology, Inc., Boise, Id.

[*] Notice: This patent is subject to a terminal disclaimer.

[21] Appl. No.: 09/090,964

[22] Filed: Jun. 4, 1998

Related U.S. Application Data

[63] Continuation of application No. 08/603,470, Feb. 20, 1996, Pat. No. 5,773,356.

[51] Int. Cl.$^7$ .................................................. H01L 21/322
[52] U.S. Cl. .................... 438/473; 438/471; 438/143; 438/310; 438/402; 148/DIG. 50
[58] Field of Search .................. 438/471, 473, 438/474, 147, 310, 402, FOR 145, FOR 146, FOR 144; 148/DIG. 60

[56] References Cited

U.S. PATENT DOCUMENTS

| | | | |
|---|---|---|---|
| 4,116,719 | 9/1978 | Shimizu et al. | 148/1.5 |
| 4,144,100 | 3/1979 | MacIver et al. | 148/1.5 |
| 4,178,191 | 12/1979 | Flatley | 148/1.5 |
| 4,665,425 | 5/1987 | Piotrowski | 357/49 |
| 4,717,680 | 1/1988 | Piotrowski | 437/31 |
| 4,960,731 | 10/1990 | Spitz et al. | 438/476 |
| 4,986,841 | 1/1991 | Oyoshi et al. | 65/30.13 |
| 5,162,241 | 11/1992 | Mori et al. | 438/471 |
| 5,183,767 | 2/1993 | Baratte et al. | 437/11 |
| 5,198,371 | 3/1993 | Li | 437/11 |
| 5,244,819 | 9/1993 | Yue | 437/11 |
| 5,272,373 | 12/1993 | Baratte et al. | 257/609 |
| 5,453,385 | 9/1995 | Shinji | 437/11 |
| 5,578,507 | 11/1996 | Kuroi | 438/474 |
| 5,731,637 | 3/1998 | Hori et al. | . |
| 5,757,063 | 5/1998 | Tomita et al. | . |
| 5,773,356 | 6/1998 | Gonzalez et al. | 438/471 |

FOREIGN PATENT DOCUMENTS 4218685  4/1993  Germany.

OTHER PUBLICATIONS

Handout, 2nd annual "Smart and Economic Device and Process Designs for ULSI Using MeV Technology" Seminar, sponsored by Genus, Inc., Jul. 20, 1994, 10 pages.

*Primary Examiner*—Trung Dang
*Attorney, Agent, or Firm*—Wells, St. John, Roberts, Gregory & Matkin

[57] ABSTRACT

In one aspect, the invention pertains to a method of forming a gettering region within an Si semiconductor wafer, the method including: a) providing a semiconductor material wafer; b) providing a background region within the semiconductor material wafer, the background region being doped with a first-type conductivity enhancing dopant, the first-type conductivity enhancing dopant being either n-type or p-type; c) implanting a second-type conductivity enhancing dopant into the background region to form a second-type implant region entirely contained within the background region, the second-type conductivity enhancing dopant being of an opposite type than the first-type conductivity enhancing dopant of the background region; and d) implanting a neutral-conductivity-type conductivity enhancing dopant into the second-type implant region to form a metals gettering damage region entirely contained within the second-type implant region. The invention also pertains to gettering region structures.

11 Claims, 4 Drawing Sheets

GETTERING REGIONS AND METHODS OF FORMING GETTERING REGIONS WITHIN A SEMICONDUCTOR WAFER

RELATED PATENT DATA

This patent resulted from a continuation application of U.S. patent application Ser. No. 08/603,470 filed Feb. 20, 1996 now U.S. Pat. No. 5,773,356.

TECHNICAL FIELD

This invention relates generally to methods of forming gettering regions within silicon semiconductor wafers and to gettering regions formed by such methods.

BACKGROUND OF THE INVENTION

Impurity contamination of Si semiconductor wafers is a problem within the semiconductor industry. Of particular concern are metallic contaminants, such as iron, nickel and copper. When such impurities are present in a Si semiconductor device, the impurities degrade the characteristics and reliability of the device. As integration in semiconductor devices becomes increasingly dense, the tolerance for metallic contaminants becomes increasingly stringent.

Among the methods for decreasing metallic (contamination in semiconductor wafers are methods for improving cleanliness in plants which manufacture such semiconductive devices. However, regardless of how many steps are taken to insure clean production of semiconductor devices, some degree of contamination by metal is inevitable. Accordingly, it is desirable to develop methods and structure for isolating metallic contaminants present in semiconductor wafers from devices which are ultimately formed within and upon such wafers. The act of isolating these contaminants is generally referred to as gettering, as the contaminants are gathered, or gettered, to specific areas within a semiconductor wafer. conventional processes for gettering metallic contaminants often focus on creating defects or damage within a semiconductor wafer in a region where gettering is sought to occur. Generally, such gettering regions are formed well below the regions of a wafer where device formation will ultimately occur and separated from such regions by an expanse of substrate. Two embodiments of such prior art methods are shown with reference to FIGS. 1 and 2. Referring to these figures, a semiconductor wafer 10 comprises a front-side surface 12 and a backside surface 14. Front-side surface 12 is defined as a surface where device formation will ultimately occur. A damage region 16 is formed beneath front-side surface 12 and is placed deep enough within the substrate that later devices formed on front-side surface 12 are isolated from the damage region 16. Damage region 16 is typically formed by introducing impurities into the lattice of the semiconductor material of wafer 10. In FIG. 1, damage region 16 is a layer within the middle of substrate 10, while in FIG. 2, damage region 16 is a layer along back-side 14 of wafer 10. After damage region 16 is formed, wafer 10 is heated to drive metallic contaminants into the damage region.

A problem of increasing concern as semiconductor devices become increasingly smaller is substrate-background current, or diffusion current. Such diffusion current is function of device temperature and increases exponentially with temperature. Thus, if the temperature of a semiconductor wafer increases, such as typically occurs during operation of semiconductor devices, the diffusion current generally also increases. At a given temperature, more diffusion current will generally form from a defect region of a semiconductor wafer than from a region without defects. Thus, damage regions 16 tend to generate more diffusion current at a given temperature than do other-regions of a semiconductor wafer 10.

The diffusion current electrons formed in damage region 16 will generally drift away from damage region 16, potentially toward front-side surface 12. Such electrons at front-side surface 12 may degrade the performance of devices that are later formed on surface 12.

For the above-described reasons, it would be desirable to develop a gettering region which could collect diffusion current electrons. Also, since hole counterparts of the diffusion current electrons can also be generated as the diffusion current electrons are generated, it would also be desirable to develop a gettering region which could collect such holes.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In one aspect of the invention, the invention is a method of forming a gettering region within an Si semiconductor wafer comprising the following steps:

providing a semiconductor material wafer;

providing a background region within the semiconductor material wafer, the background region being doped with a first-type conductivity enhancing dopant, the first-type conductivity enhancing dopant being either n-type or p-type;

implanting a second-type conductivity enhancing dopant into the background region to form a second-type implant region entirely contained within the background region, the second-type conductivity enhancing dopant being of an opposite type than the first-type conductivity enhancing dopant of the background region; and implanting a neutral-conductivity-type conductivity enhancing dopant into the second-type implant region to form a metals gettering damage region entirely contained within the second-type implant region.

In another aspect of the invention, the invention is a method of forming a gettering region within an Si semiconductor wafer comprising the following steps:

providing a semiconductor material wafer;

implanting phosphorus within the semiconductor material wafer to form a phosphorus implant region therein;

implanting silicon within the semiconductor material wafer to form a silicon implant region; and the step of implanting silicon occurring simultaneously with the step of implanting phosphorus.

In yet another aspect of the invention, the invention is a gettering diode within an Si semiconductor material wafer comprising:

a background region within the semiconductor material wafer, the background region comprising a first-type conductivity enhancing dopant, the first-type conductivity enhancing dopant being either n-type or p-type;

a second-type conductivity implant region entirely contained within the background region, the second-type implant region comprising a second-type conductivity enhancing dopant, the second-type conductivity enhancing dopant being of an opposite type than the first-type conductivity enhancing dopant; and a metals gettering damage region entirely contained within the second-type implant region in the semiconductor material, the first-type background region and the second-type implant region to-ether forming a gettering diode which surrounds the damage region.

More specifically, the invention relates to methods of forming gettering regions within silicon semiconductor wafers and of forming gettering diodes which may collect positive or negative charges, as either electrons or holes, depending on the polarity of the collector. The invention is further described with reference to FIGS. 3–5.

Figure 1:
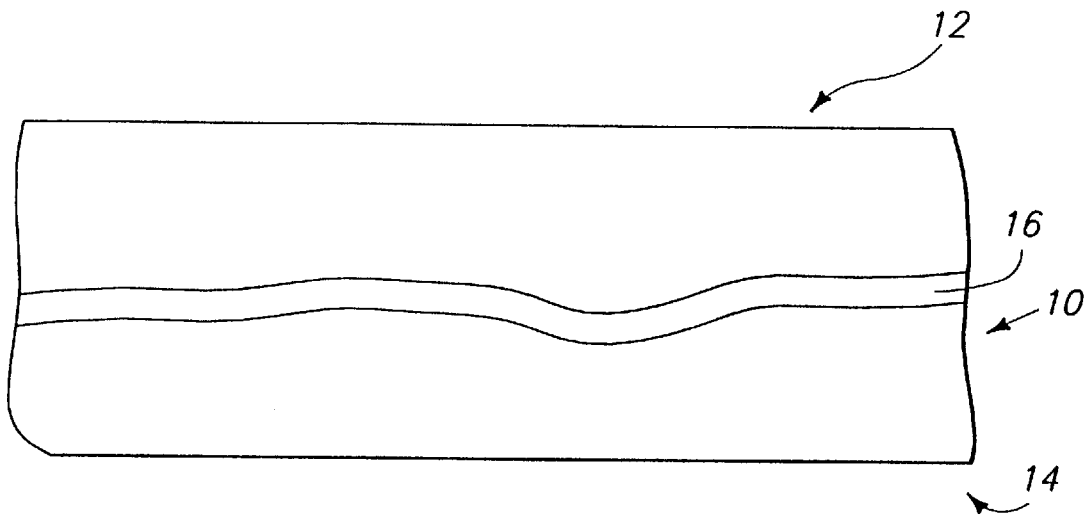
FIG. 1 is a diagrammatic fragmentary sectional view of a semiconductor wafer fragment containing a gettering region of a type known in the prior art.
Figure 2:
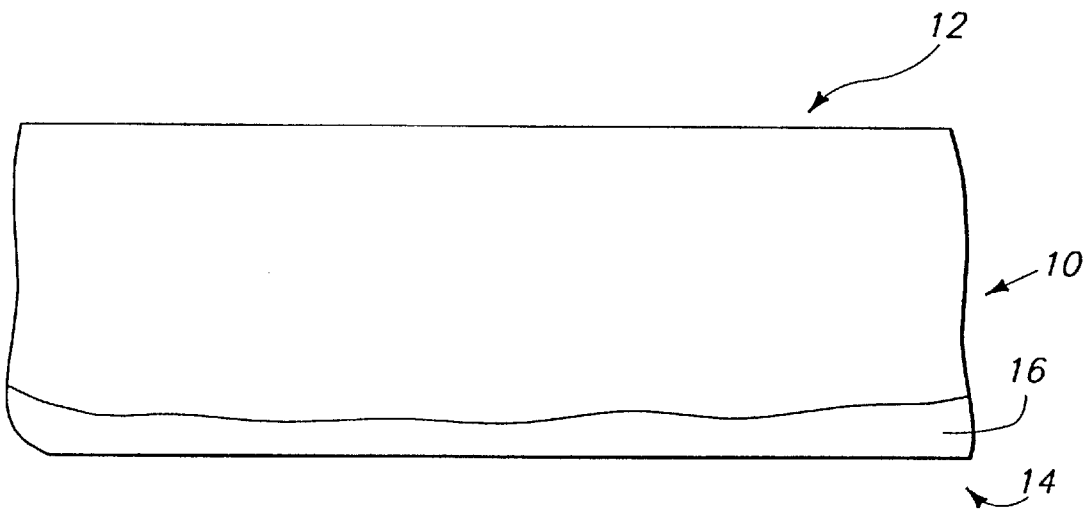
FIG. 2 is a diagrammatic fragmentary sectional view of a semiconductor wafer fragment containing a gettering region of a type known in the prior art.
Figure 3:
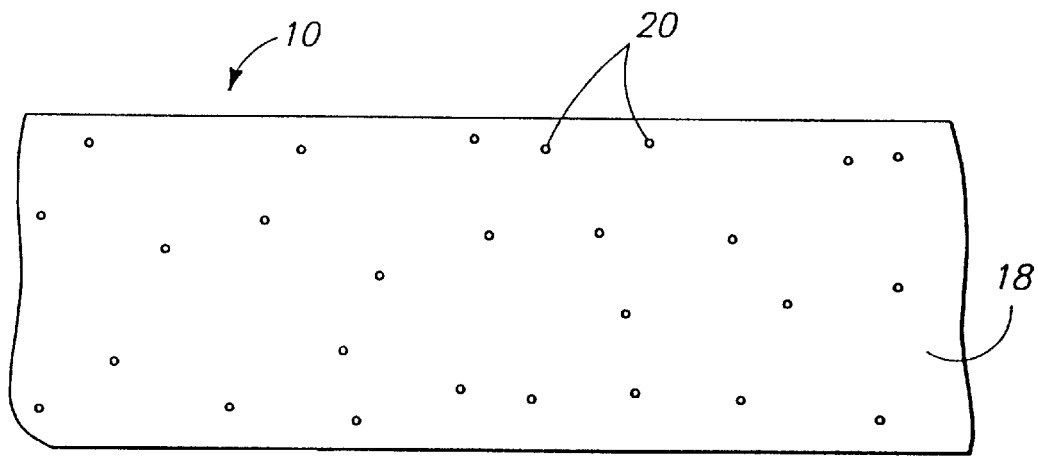
FIG. 3 is a diagrammatic fragmentary sectional view of a semiconductor wafer fragment shown at a processing step in accordance with the invention.

Referring to FIG. 3, a wafer 10 of semiconductor material, preferably silicon, is provided. Wafer 10 preferably comprises a background region 18 which is conductively doped with a first-type conductivity enhancing dopant (not shown). The first-type conductivity enhancing dopant is either n-type or p-type, so that background region 18 is either an n-type or p-type region. Wafer 10 further comprises contaminants 20, which may include metallic contaminants, such as metallic contaminants selected from the group consisting of iron, nickel and copper.

Figure 4:
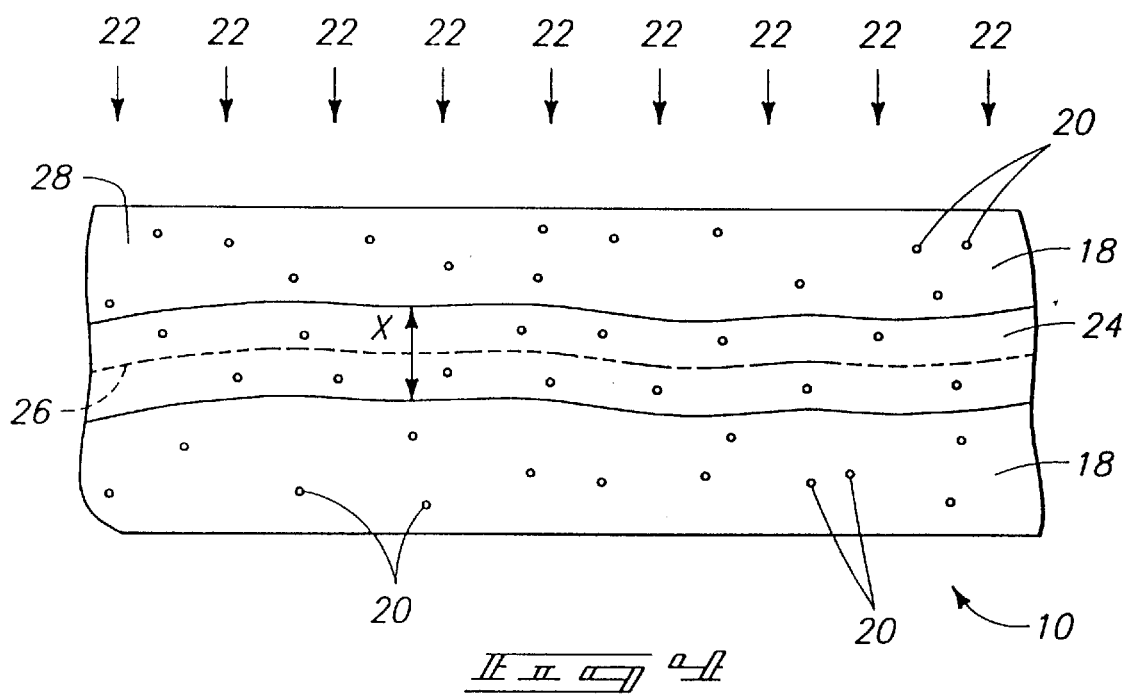
FIG. 4 is a view of the FIG. 3 fragment shown at a processing step subsequent to that shown in FIG. 3.

Referring to FIG. 4, a second-type conductivity enhancing dopant 22 is implanted into background region 18 to form second-type implant region 24 entirely contained within background region 18. Second-type dopant 22 is of an opposite type than the first-type dopant. Thus, if background region 18 is n-type, implant region 24 is p-type, and vice versa.

In the embodiment of the invention in which background region 18 is p-type and dopant 22 is n-type, dopant 22 preferably comprises phosphorus. In such a preferred embodiment, phosphorus implant region 24 contains a peak concentration depth 26, which is defined as the depth at which the maximum concentration of phosphorus from phosphorus implant 22 is found. Typically, an implant such as implant 22 will produce a Gaussian distribution of implanted material across a thickness "X". Thus, the peak concentration depth 26 is typically found at approximately the center of implanted region 24. Preferably, dopant 22 is implanted at an energy of 2800 KeV and a dose of from about $1 \times 10^{12}$ atoms/cm$^2$ to about $5 \times 10^{13}$ atoms/cm$^2$, with 1 most preferred dose being about $5 \times 10^{12}$ atoms/cm$^2$. Under such preferable conditions, the phosphorus peak concentration depth 26 is greater than or equal to about 1 micron beneath an outer surface 28 of the semiconductor material of wafer 10, and most preferably is greater than or equal to about 2 microns beneath an outer surface 28, and less than or equal to about 4 microns beneath the outer surface. Also, under such preferable conditions, phosphorus implant region 24 will have a thickness "X" within which substantially all of the implanted phosphorus is contained which is greater than about 2 microns and less than about 5 microns.

In the embodiment of the invention in which the background region 18 is n-type and dopant 22 is p-type, dopant 22 preferably comprises boron. In this embodiment, implant 22 most preferably comprises atomic boron, and is preferably implanted a dose of from about $1 \times 10^{12}$ atoms/cm$^2$ to about $5 \times 10^{13}$ atoms/cm$^2$, and an energy of about 930 KeV.

Figure 5:
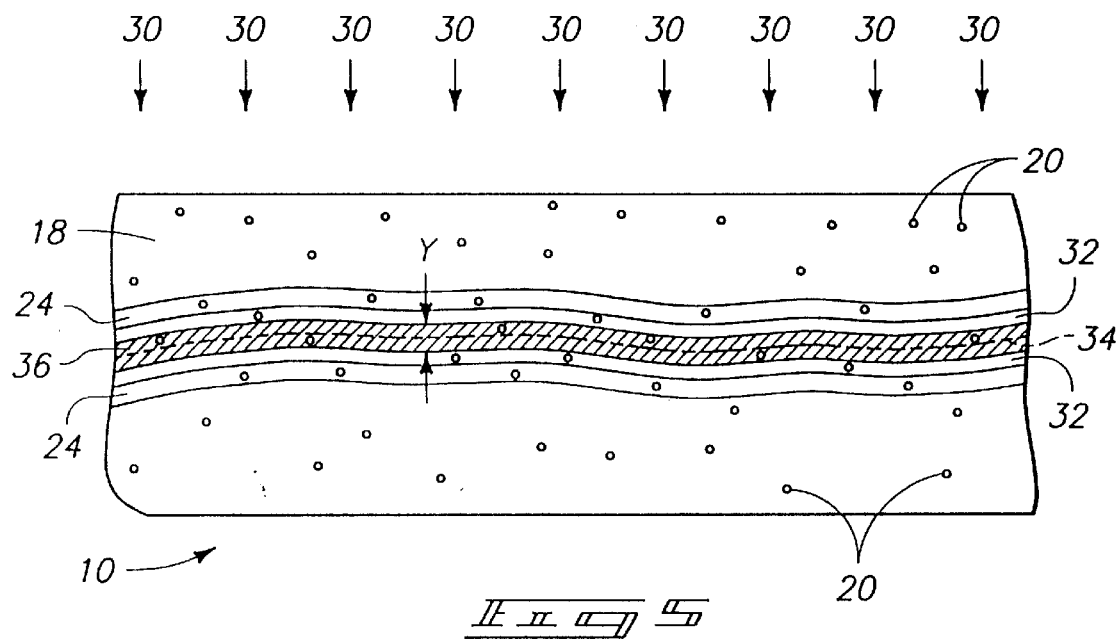
FIG. 5 is a view of the FIG. 3 wafer shown at a step subsequent to that of FIG. 4.

Referring to FIG. 5, a neutral-conductivity-type dopant 30 is implanted to form a neutral-conductivity-type-dopant implant region 32 within wafer 10. Neutral-type dopant 30 preferably comprises an element selected from the group consisting of Si, O, C, N, Ar and Ge.

Region 32 is shown as being entirely contained within region 24, however, in other embodiments of the invention which are not shown, region 32 may extend beyond region 24. Regardless of whether region 32 is entirely contained within region 24, the implant of dopant 30 preferably forms a metals gettering damage region 36 entirely contained within second-type implant region 24.

Neutral-conductivity-type-dopant-implant region 32 has a peak concentration depth 34 wherein the concentration of neutral-conductivity-type-dopant is maximized. As shown, peak concentration depth 34 preferably lies within implant region 24.

Damage region 36 has a thickness "Y", which is preferably from about 0.5 microns to about 0.8 microns. Accordingly, if dopant 30 comprises atomic silicon, the implant of dopant 30 is preferably conducted at an energy of from about 2500 KeV to about 2800 KeV and with a dose of from about $9 \times 10^{12}$ atoms/cm$^2$ to about $9.5 \times 10^{14}$ atoms/cm$^2$. Most preferably, the dose is about $1 \times 10^{14}$ atoms/cm$^2$.

In the shown embodiment, neutral-conductivity-type-dopant 30 is implanted after the implant of second-type dopant 22. However, neutral-conductivity-type dopant 30 could also be implanted before, or simultaneously with, dopant 22. If dopant 30 is implanted simultaneously with dopant 22, dopant 30 is preferably comprises atomic silicon and dopant 22 preferably comprises atomic phosphorus. Under such preferable conditions, the atomic silicon will preferably be generated from a source gas comprising one or more of the compounds silicon hexafluoride and silicon hexachloride, and the atomic phosphorus will preferably be generated from a source gas comprising phosphine.

Under the preferred conditions in which dopant 22 comprises phosphorus and dopant 30 comprises silicon, the total combined dose of the dopants 22 and 30 is preferably from $1 \times 10^{13}$ atoms/cm$^2$ to about $1 \times 10^{15}$ atoms/cm$^2$, and most preferably is about $1 \times 10^{14}$ atoms/cm$^2$. Even though the neutral-type dopant 30 will generally make the largest contribution to the formation of damage layer 36, the implant of second-type dopant 22 will likely also create some damage to wafer 10. Thus, the total combined dose of dopant 22 and dopant can be an important parameter to control in regulating the overall 30 size of damage region 36.

Figure 6:
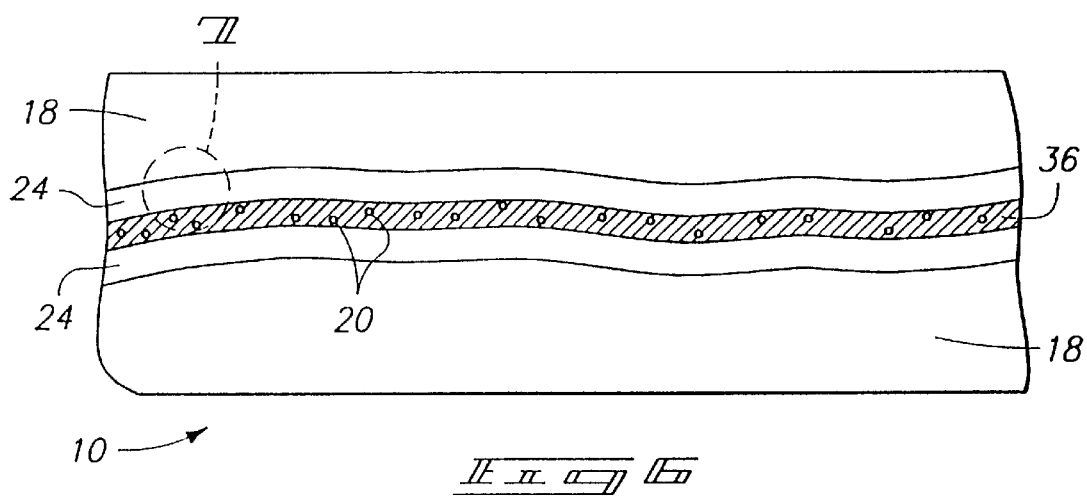
FIG. 6 is a view of the FIG. 3 wafer shown at a step subsequent to that of FIG. 5.

Referring to FIG. 6, the wafer of FIG. 4 is show n subsequent to a thermal processing step. As shown, the thermal processing step has driven metallic contaminants 20 into damage region 36. Thus, contaminants 20 are effectively gathered within the damage region 36, so that the region functions as a gettering region 36. It will be noted that neutral-type-dopant implant region 32 of FIG. 5 is not shown in FIG. 6. This is because a gettering thermal processing step will typically diffuse neutral type dopant 30 throughout a semiconductor material. Accordingly, there will generally be no clearly defined neutral-type-dopant implant region 32 subsequent to such a thermal processing step.

Figure 7:
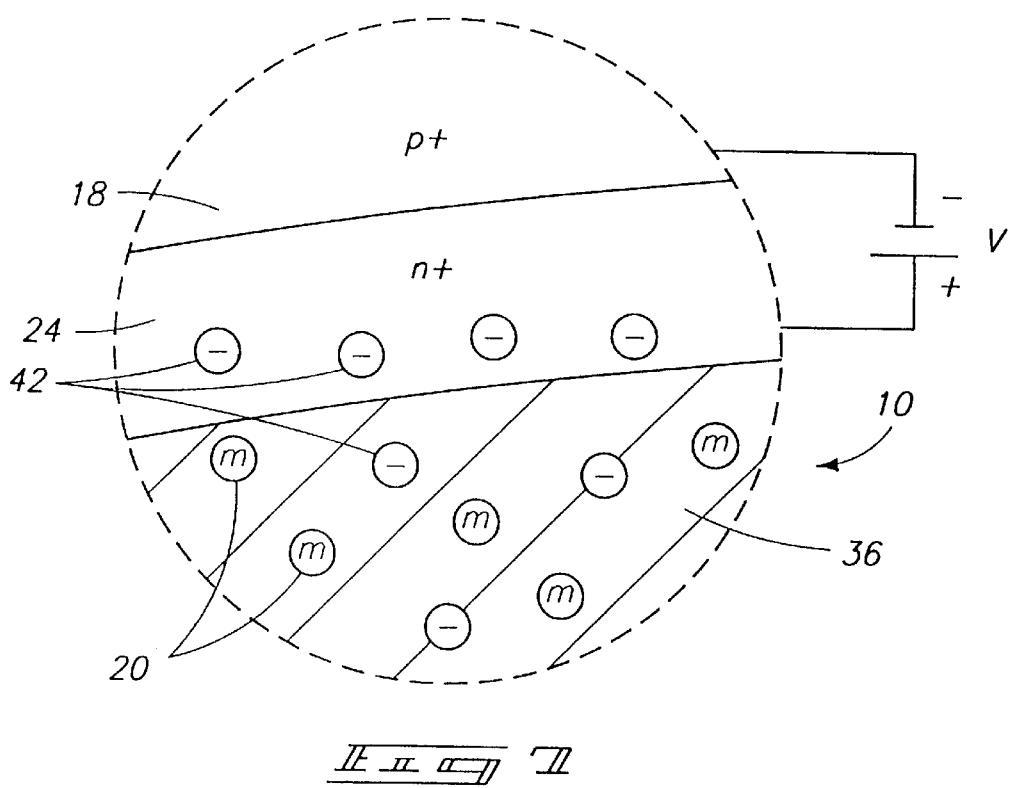
FIG. 7 is an expanded view of area 7 of FIG. 6 showing one embodiment of the invention.
Figure 8:
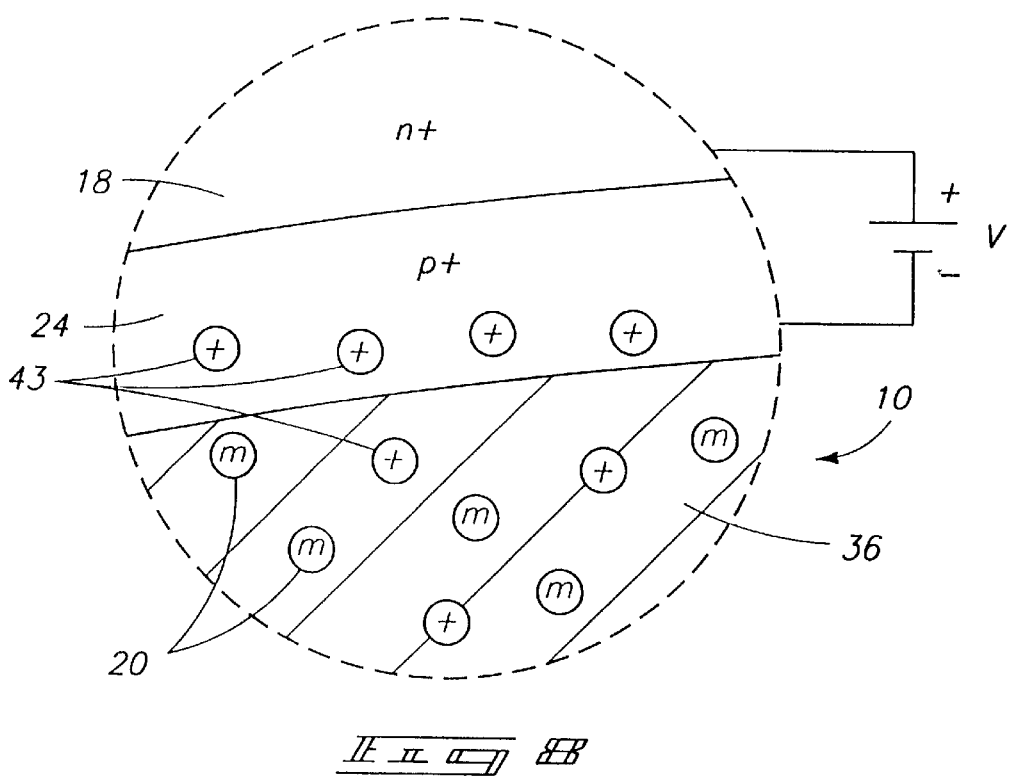
FIG. 8 is an expanded view of area 7 of FIG. 6 showing an embodiment of the invention different from the embodiment shown in FIG. 7.

FIGS. 7 and 8 illustrate expanded views of FIG. 6 and further illustrate two separate embodiments of the invention. FIG. 7 illustrates an embodiment of the invention in which background region 18 is a p-type region and in which implant region 24 is an n-type region. In contrast, FIG. 8 illustrates the opposite arrangement of regions wherein background region 18 is an n-type region and implant region 24 is a p-type region. FIGS. 7 and 8 illustrate separate embodiments in which a p-type region and an n-type region together form a gettering diode 40 which can be used to restrict the flow of electrons 42 within a semiconductor material 10 and to thereby contain the spurious electrons 42. Referring first to FIG. 7, the figure illustrates an embodiment of the invention in which a damage region 36 is contained within an n-type region 24 which itself is contained within a p-type region 18. Together, n-type region 24 and p-type region 18 form the gettering diode 40. As illustrated, a reverse bias is applied to the gettering diode 40 to effectively contain diffusion current electrons 42 within n-type region 24. In the shown embodiment, contaminants 20 are illustrated as metallic contaminants "M" which have gettered into damage region 36.

Referring to FIG. 8, an embodiment of the invention is shown in which a damage region 36 is contained within a p-type region 24 which in turn is contained within an n-type region 18. Together, n-type region 18 and p-type region 24 form a gettering diode 40 within which spurious electrons 42 are contained. As illustrated, a reverse bias is applied to gettering diode 40 to contain holes 43 within p-type region 24. Such holes 43 may, for instance, comprise the positive counterpart of diffusion current electrons 42.

Methods for applying reverse bias to diodes are generally known to persons of ordinary skill in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a gettering region within a semiconductor substrate, comprising:

providing a semiconductor material substrate;

forming a first region within the substrate material;

implanting a dopant into the substrate material to form a second region entirely contained within the first region; the first region being either an n-type or p-type region and the dopant being the other of the n-type or p-type, the first and second regions together comprising a gettering diode;

implanting a neutral-conductivity-type conductivity enhancing dopant into the second region to form a metals gettering damage region entirely contained within the second region; and applying a voltage bias to the gettering diode to effectively collect electrons within the gettering diode.

2. A method of forming a gettering region within a semiconductor substrate, comprising:

providing a semiconductor material substrate;

forming a first region within the substrate material;

forming a second region entirely contained within the first region; the first region being either an n-type or p-type region and the second region being the other of the n-type or p-type region, the first and second regions together comprising a gettering diode;

implanting a neutral-conductivity-type conductivity enhancing dopant into the second region to form a metals gettering damage region entirely contained within the second region; and applying a voltage bias to the gettering diode to effectively collect electrons within the gettering diode.

3. The method of claim 2 wherein the neutral-conductivity-type conductivity enhancing dopant comprises an element selected from the group consisting of Si, O, C, N, Ar, and Ge.

4. The method of claim 2 wherein the step of implanting the neutral-conductivity-type conductivity enhancing dopant occurs after the step of forming the second region.

5. The method of claim 2 wherein the step of implanting the neutral-conductivity-type conductivity enhancing dopant occurs before the step of forming the second region.

6. The method of claim 2 wherein the step of implanting the neutral-conductivity-type conductivity enhancing dopant occurs simultaneously with the step of forming the second region.

7. The method of claim 2 wherein the first region is n-type and wherein the second region is p-type.

8. The method of claim 2 wherein the first region is n-type, wherein the second region is p-type, and wherein the applying a bias to the gettering diode comprises applying a reverse bias to the gettering diode.

9. The method of claim 2 wherein the first region is p-type and wherein the second region is n-type.

10. The method of claim 2 wherein the first region is p-type, wherein the second region is n-type, and wherein the applying bias to the gettering diode comprises applying a reverse bias to the gettering diode.

11. A method of forming a gettering region within an Si semiconductor wafer comprising the following steps:

providing a semiconductor material wafer, the wafer having an upper surface;

providing a background region within the semiconductor material wafer, the background region being doped with a first-type conductivity enhancing dopant, the first-type conductivity enhancing dopant being either n-type or p-type;

implanting a second-type conductivity enhancing dopant into the background region to form a second-type implant region entirely contained within the background region, the second-type conductivity enhancing dopant being of an opposite type than the first-type conductivity enhancing dopant of the background region, the first-type background region and the second-type implant region together forming a gettering diode, the second-type implant region being formed to have a peak concentration depth at greater than 1 micron beneath the upper surface of the wafer;

is implanting a neutral-conductivity-type conductivity enhancing dopant into the second-type implant region to form a metals gettering damage region entirely contained within the second-type implant region, and applying a voltage bias to the gettering diode to effectively collect electrons within the gettering diode.

* * * * *

UNITED STATES PATENT AND TRADEMARK OFFICE
CERTIFICATE OF CORRECTION

PATENT NO. : 6,114,223
DATED : September 5, 2000
INVENTOR(S) : Fernando Gonzalez; Jeffrey W. Honeycutt It is certified that error appears in the above-identified patent and that said Letters Patent is hereby corrected as shown below:

Column 1,
Line 27, delete "(" before -- contamination --
Line 31, replace "metal" with -- metals --
Line 38, end paragraph with "wafer" begin new paragraph with -- Conventional --

Column 2,
Line 4, replace "other-regions" with -- other regions --

Column 3,
Line 8, delete ":" after -- semiconductor --
Line 29, replace "to-ether" with -- together --
Line 65, replace "1" with -- a --

Column 4,
Line 20, at the end of line 20, continue with lines 21 through 27 with no intervening paragraph break
Line 61, replace "show n" with -- shown --

Column 6,
Line 60, delete "is" before -- implanting --

Signed and Sealed this

Thirtieth Day of October, 2001

Attest:

NICHOLAS P. GODICI
Attesting Officer
Acting Director of the United States Patent and Trademark Office